United States Patent [19]
Ordidge et al.

[11] Patent Number: 4,509,015
[45] Date of Patent: Apr. 2, 1985

[54] NUCLEAR MAGNETIC RESONANCE METHODS

[76] Inventors: Roger J. Ordidge, 36 Brampton Dr., Stapleford, Nottingham, Nottinghamshire; Peter Mansfield, 15 Devonshire Ave., Beeston, Nottingham, Nottinghamshire, both of England

[21] Appl. No.: 418,641
[22] Filed: Sep. 16, 1982
[30] Foreign Application Priority Data Sep. 21, 1981 [GB] United Kingdom ............... 8128524

[51] Int. Cl.³ .............................................. G01R 33/08
[52] U.S. Cl. ..................................... 324/309; 324/307
[58] Field of Search ................ 324/300, 307, 309, 311

[56] References Cited

U.S. PATENT DOCUMENTS 4,318,043 3/1982 Crooks ................................ 324/309
4,355,282 10/1982 Young ................................. 324/309

Primary Examiner—Michael J. Tokar
Attorney, Agent, or Firm—Watts, Hoffmann, Fisher & Heinke Co.

[57] ABSTRACT

This invention provides methods of investigating a body by nuclear magnetic resonance. Nuclear magnetic resonance is preferentially excited in a slice of the body and the resulting free induction decay signals are detected in the presence of a magnetic field having first and second gradients ($G_y$, $G_x$).

In one proposed method two experiments are performed in which the phase of the first gradient ($G_y$) reversal is opposite, and the detected signals from the two experiments are edited to obtain a set of signals, for Fourier transformation, occurring when the first gradient has one sense. Two such sets may be obtained, one for each sense of the first gradient, and the data obtained after Fourier transformation re-ordered and added.

In a second proposed method the second gradient ($G_x$) is applied only when the first gradient ($G_y$) has a given sense, and the free induction decay signals obtained when both gradients are present, and when only the first gradient is present, are separately processed.

In a third proposed method, the first gradient ($G_y$) is temporarily removed before each reversal of its sense, and the second gradient ($G_x$) is reversed while the first gradient is removed, the magnitude of the second gradient being controlled so that the time integral of the second gradient at the beginning of each period when the first gradient has a given sense is the same as at the end of the preceding such period, the free induction decay signals occurring when the first gradient has said given sense only being used for data retrieval.

19 Claims, 11 Drawing Figures

NUCLEAR MAGNETIC RESONANCE METHODS

This invention relates to methods and apparatus for investigating a body by nuclear magnetic resonance (NMR). Such methods and apparatus have application in obtaining images of non-homogeneous bodies and much interest has been aroused in applying these techniques to obtaining images of biological tissue and even living subjects. The technique provides an alternative facility to the use of X-rays and is not prone to the known dangers of exposure of living matter to X-rays.

NMR methods involve the excitation of nuclear spins within a body by the use of magnetic fields and radio frequency pulses. Signals from the free induction decay of spins are read out and may be subject to Fourier transformation in order to obtain image information. To obtain spatial discrimination a main magnetic field which is static may have superimposed thereon a magnetic field gradient. An example of such a method using switched magnetic field gradients is described in British patent specification No. 1,596,160. In that specification there is described a method of obtaining signals representing the nuclear magnetic resonance spin density distribution in a body which comprises preferentially exciting nuclear magnetic resonance in a slice of a body, applying a magnetic field to said body with gradients in said slice in different directions and repetitively reversing the sense of one of said gradients at a rate which allows cyclic regrowth and decay of the free induction decay (FID) signal from the sample, and reading out the resulting FID signal.

It is an object of the present invention to provide an improved form of such a method of investigating a body by nuclear magnetic resonance.

According to one aspect of the present invention, a method of investigating a body by nuclear magnetic resonance comprises: preferentially exciting nuclear magnetic resonance in a slice of the body; applying for a first period a magnetic field to said body with first and second gradients in first and second directions respectively in said slice, the sense of said first gradient being periodically reversed; re-exciting said slice and re-applying said magnetic field for a second period but with the first gradient periodically reversed in sense with opposite phase to that obtaining during said first period; detecting the resultant free induction decay signals occurring during each application of said magnetic field; editing the detected signals to obtain a set of signals occurring when said first gradient has one sense; and processing said set of signals to retrieve data.

According to a second aspect of the present invention, a method of investigating a body by nuclear magnetic resonance comprises preferentially exciting nuclear magnetic resonance in a slice of the body; applying a magnetic field to said body with first and second gradients in first and second directions respectively in said slice, said first gradient being periodically reversed and said second gradient being applied only during periods when the first gradient has one of its two possible senses; detecting the free induction decay signals occurring during application of said magnetic field; assembling the resulting signals occurring during periods when said first and second gradients are both applied to form a first set of signals; assembling the resulting signals occurring during periods when only said first gradient is applied to form a second set of signals; processing the first set of signals by single Fourier transformation to derive data; and processing said second set of signals by double Fourier transformation to derive further data.

According to a third aspect of the present invention, a method of investigating a body by nuclear magnetic resonance comprises: preferentially exciting nuclear magnetic resonance in a slice of the body; applying a magnetic field to said body with first and second gradients in first and second directions respectively in said slice, said first gradient being periodically removed and then re-applied with its sense reversed, and said second gradient having one sense during each period when said first gradient is applied and being of the opposite sense at least during some of the periods when said first gradient is removed; and the magnitude of the second gradient being controlled so that the time integral of the second gradient at the beginning of each period when the first gradient has a given sense is substantially equal to the integral of the second gradient at the end of the preceding period when said first gradient had said given sense; detecting the free induction decay signals occurring during each period when said first gradient has said given sense, and processing the detected signals to retrieve data.

In order that the invention may be more fully understood reference will now be made to the accompanying drawings in which.

Certain aspects of methods of investigating a body by nuclear magnetic resonance wherein, as in the methods of the present invention, the direction of the gradient of an applied magnetic field is repetitively reversed will first be discussed and explained.

Figure 1:
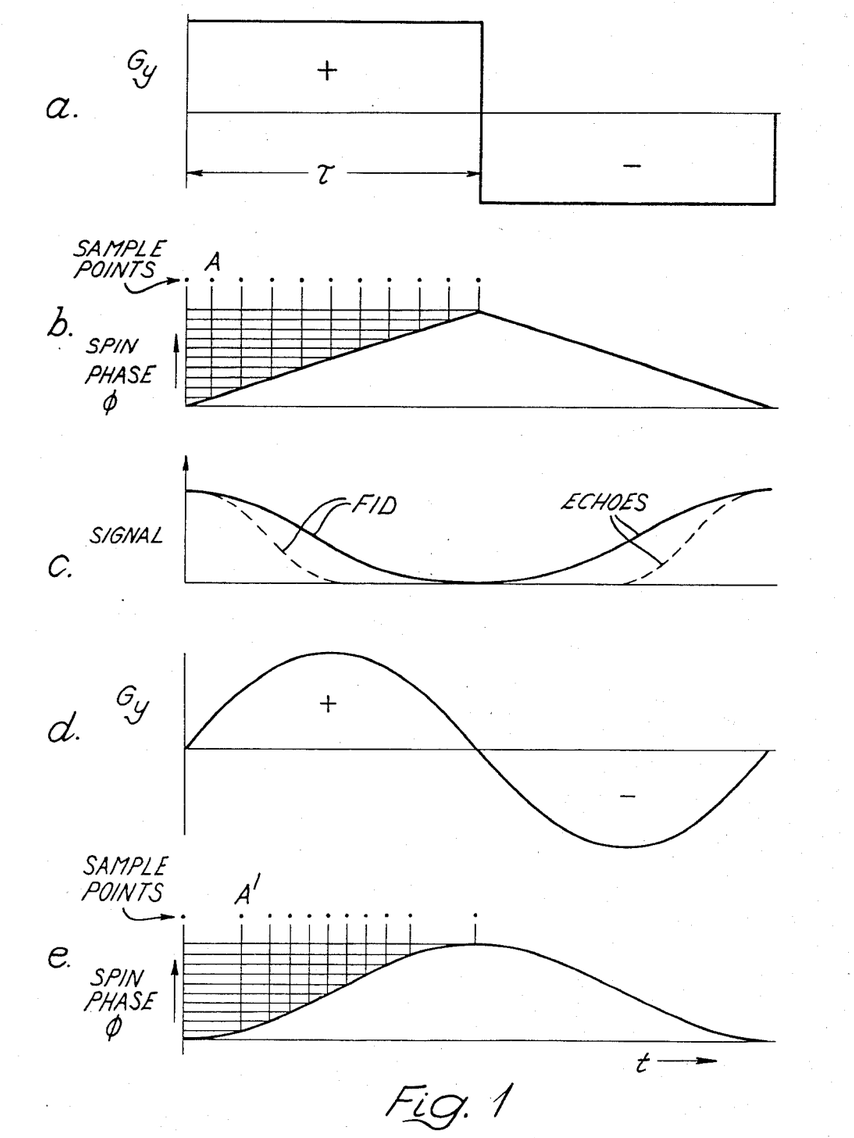
FIG. 1 shows alternative sampling techniques with square wave and sinusoidal modulation of a gradient.

Referring to FIG. 1, consider a sample or object being investigated which is placed in a static magnetic field B which extends in the Z-direction. The sample is subject to sequences of radio frequency(RF) fields and switched magnetic field gradients, as described in British patent specification No. 1,596,160. For reading out information from the object it is subjected to a read gradient $G_y$ extending in the Y-direction which is repeatedly reversed with cycle time $\tau$. If $G_y$ is of constant amplitude as shown at FIG. 1(a) there is a constant evolution of the signal in spin phase and the Fourier transform (FT) of the signal is linear. The free induction decay (FID) signal and its echo as shown by the dotted line at FIG. 1(c) can then be regularly sampled corresponding to the constant evolution of the signal. However, if $G_y$ varies sinusoidally, as for example illustrated in FIG. 1(d), then the FID signal appears as shown by the full line in FIG. 1(c) and the accumulated signal phase of the evolution signal must be the same when the FID has completely decayed to zero amplitude. However, in dephasing, it proceeds non-linearly as indicated in FIG. 1e. Take sample point A in FIG. 1b, where the gradient $G_y$ has remained at its full value. For $G_y$ varying as in FIG. 1d this point must be displaced to A' as in FIG. 1e. The signal dephasing and evolution slows down so that it reaches the same signal height later at point A' etc. This is quite general for any modulation $G_y(t)$ and is not limited to sinusoidal modulation. If sampling is slowed down in unison with the gradient behaviour as indicated, then the accumulated phase of signal at each sample point will be the same as if the gradient were kept constant. Thus the sampling must be non-regular or non-linear but the FT is linear.

Let the accumulated phase of a particular volume element of spins at $\Delta y$ in the steady gradient be $$\phi_n = \gamma \Delta y G_y \tau_n \quad (1)$$

if regularly sampled at time $\tau_n = n\tau_o$ where $\gamma$ is the magnetogyric ratio. Now if $G_y(t)$ is some arbitrary function of time, we now require for each successive sampling step that:

$$\phi_n = \int_o^{\tau_n} \gamma \Delta y G_y(t) dt = n\phi_1 \quad (2)$$

where $\phi_1 = \gamma \Delta y G_y \tau_o$, and now, of course $\tau_n$ is non-linearly stepped.

Thus for example if $$G_y(t) = a \cos w_g t \quad (3)$$

where $w_g$ is the angular frequency of the gradient modulation then sampling must follow a sine function, since $$\phi_n = \int_o^{\tau_n} \gamma \Delta y \, a \cos w_g t \, dt \quad (4)$$

$$\phi_n = \frac{\gamma \Delta y a}{w_1} \sin w_g \tau_n \quad (5)$$

Another way of looking at the problem is that the areas under the gradient curves for successive sample points must be in equal increments. The effect of this procedure is of course to lengthen the sampling process but the total length of the experiment can be retained at its original value by increasing the magnitude of $G_y$. For the sinusoidal or cosinusoidal cases this factor is $\pi/2$. An important consequence of non-regular sampling is that any originally linear evolution of the spin system now becomes non-linear following FT. Thus for example in echo planar imaging schemes described in British patent specification No. 1,596,160, the broadening gradient $G_x$ would have to be modified because its role is to introduce linear broadening of the discrete profiles obtained by $G_y$ modulation.

In general, then, if the experiment is performed off resonance with a broadening profile gradient $G_x$ then this too must be modulated in unison with $G_y$ but not reversed. That is to say, evolution in the same direction is required and that means that $G_y = b \cos w_g t$ while $G_x = c |\cos w_g t|$ where b and c are constants.

The non-linear sampling principle can be applied to all imaging schemes where linear gradients are required to be switched on and off or in any way periodically modulated. For example, non-linear signal sampling may be applied to advantage in (a) the projection reconstruction method where FID's are observed (following either a selective or non-selective 90°RF pulse) in a time-dependent read gradient which is in general easier to generate; (b) the Fourier imaging method described by Kumar, Welti and Ernst in which the total magnetisation following a short non-selective 90° pulse is allowed to evolve in three successively applied gradients $G_x$, $G_y$ and $G_z$. In that version $G_x$, $G_y$ and $G_z$ are stepped square wave gradients, but provided accumulated total phase is stepped in equal amounts, that is to say (i) non-linear incrementing of the gradient period $t_x$, $t_y$ is performed and (ii) non-regular sampling of the signal in the read gradient $G_z$ is done, the problems of rapid gradient switching are resolved; (c) line scanning methods; (d) the multiple sensitive point method of Hinshaw which uses modulated gradients would also benefit by non-linear sampling. Attention is directed in this connection to U.K. Pat. No. 1,584,949.

Figure 2:
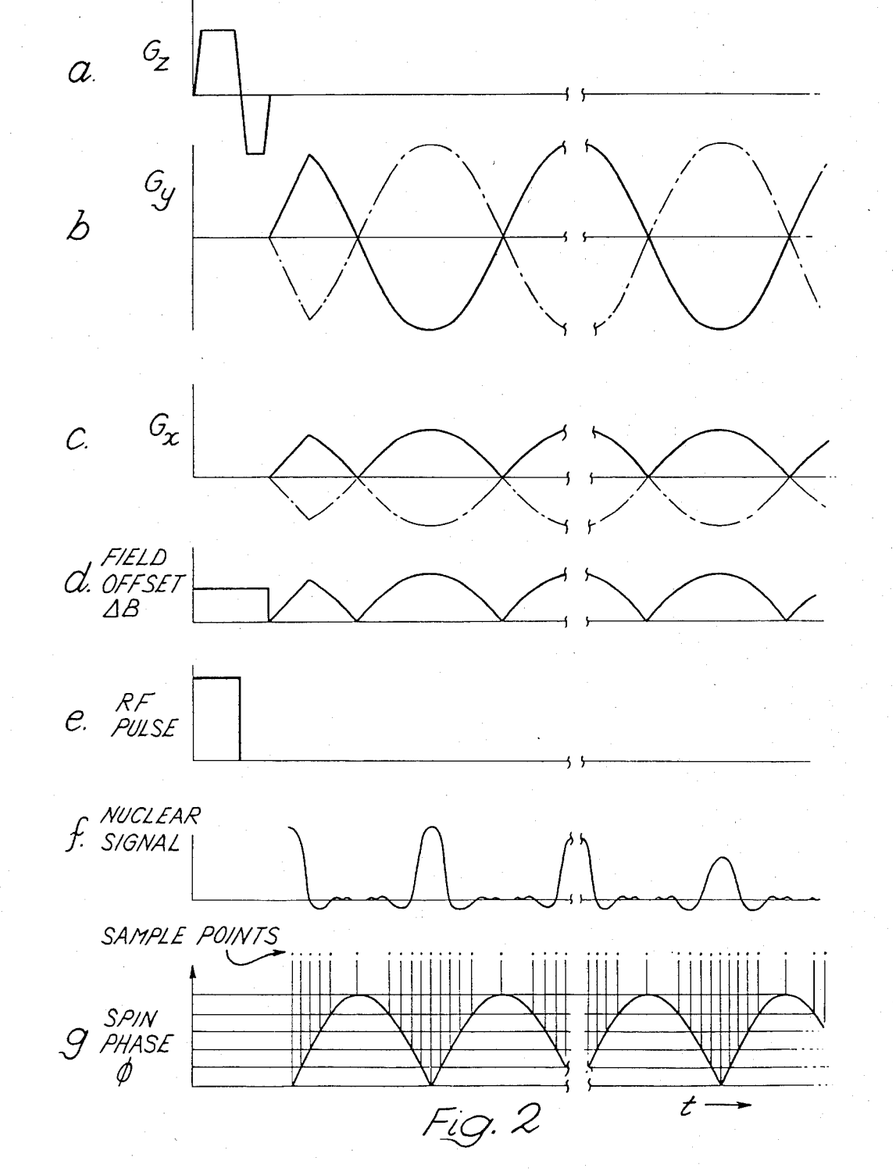
FIG. 2 shows an experiment with cosinusoidal modulation and using non-linear sampling.

Several embodiments of echo-planar imaging are possible. One embodiment, which involves cosinusoidal modulation of period $2\tau$, is described with reference to FIG. 2 and is a two-dimensional form which relies on an initial focussed selective irradiation RF pulse as shown at FIG. 2e to select a slice of spins. Following selective excitation in a magnetic field gradient $G_z$ as shown at FIG. 2a, which is shown trapezoidal in this case because the rise, fall and reversal times of $G_z$ times need not be particularly fast, read gradient $G_y$ is switched on from zero, rampwise to its maximum value before going into a cosine modulation. The waveform of $G_y$ is shown at FIG. 2b. The broadening field gradient $G_x$ is likewise ramped up and then modulated according to a $|\cos w_g t|$ form as shown at FIG. 2c. Alternative waveform shapes may be used to establish the starting conditions. For a given waveform four possibilities exist for the starting phases corresponding to either a positive or negative $G_y$ gradient with a positive $G_x$ gradient or a positive or negative $G_y$ gradient with a negative $G_x$ gradient.

The signals expected are sketched at FIG. 2f and the non-linear sampling which in this case varies as $|\sin w_g t|$ is also shown at FIG. 2g. A different sampling pattern is required during ramp up to the cosine waveform if this particular starting condition is adopted.

If the experiment is performed on resonance a resonance offset magnetic field $\Delta B$ is not required since in that reference frame the spin system does not evolve. At resonance the received signal is detected in phase quadrature but this has a $\sqrt{2}$ S/N ratio advantage and is worth doing. The signal is recorded in phase quadrature, that is to say, in the rotating frame where both X and Y components of magnetisation are required using two analogue-to-digital converters (ADCs) recording simultaneously.

If it is desired to carry out an experiment off resonance then the offset magnetic field $\Delta B$ is also time modulated by a $|\cos w_g t|$ modulation as shown at FIG. 2d. In order to carry out this modulation additional coils and driving circuits for the coils are provided. Such driving circuits supply current to the coils of a waveform corresponding to FIG. 2d.

Generation of a trapezoidal form selection gradient, (irregularities of which have the greatest effect as the selection gradient is switched off), may be obviated if the RF pulse shape is calculated using a non-linear transform which may be combined with a suitably modulated gradient to produce the correct selection profile. Alternatively the RF pulse may be generated linearly but applied in a non-linear manner, (the discreteness of the pulse varying in duration), allowing the gradient to be modulated as desired. Again, $\Delta B$ the resonance offset, must be varied in unison with the selection gradient, but working on resonance would remove this problem.

Any linear process like spin relaxation characterised by spin-lattice relaxation time $T_1$, or spin-spin relaxation time $T_2$, diffusion, and chemical shifts, which evolve while sampling non-linearly, will of course be non-linearised.

In the cosinusoidal modulation experiment described with reference to FIG. 2 the read gradient $G_y$ is repetitively reversed to reform or refocus the signal repeatedly in order to impose a discreteness on the spin distribution. In the positive half cycles of the gradient $G_y$ the Fourier transform that is obtained from the received signal from the object corresponds to the projection profile of the object along a line in one direction. However when the gradient is reversed the negative half cycles of the $G_y$ gradient result in a projection profile along the same line in the opposite direction, that is to say it produces a mirror image of the profile.

In order to obtain a usable output, signals obtained during the negative half cycles of the gradient may be ignored. Alternatively, the signals obtained in the respective positive and negative $G_y$ gradients can be subject to separate Fourier transforms and the frequency data of the signals obtained during the negative half cycles separately reordered. Both sets of frequency data can then be co-added together to form a single composite picture. Utilising both the positive and negative signals in this way enhances the signal-to-noise ratio of the final picture by a factor of $\sqrt{2}$. The experiment described above may be termed a "single shot" cosine experiment.

The data reordering described above is required whether the modulation is cosinusoidal or else has some other waveform that is symmetrical about the time origin.

According to one aspect of the present invention the experiment described above with reference to FIG. 2 is improved, as follows.

A first experiment is carried out as has been described with reference to FIG. 2 with an RF 90° selection pulse followed by a cosine modulated gradient $+G_y$ as indicated by the solid line in FIG. 2b. If the period of the modulation of the $G_y$ gradient is increased to $4\tau$ an improvement in resolution is obtained. After a short delay the second experiment is carried out initiated by a second RF 90° selection pulse and this is followed by a gradient in the Y direction which is in antiphase to the original $G_y$ gradient, that is to say, it is as shown by the chain dotted line in FIG. 2b. The purpose of the two separate experiments is to allow the nuclear signal responses to be edited to produce a first train of echoes occurring wholly in a positive $G_y$ gradient and a second train of echoes occurring wholly in a negative $G_y$ gradient. The edited FID signals are then Fourier transformed to produce non-distorted images from the positive and negative gradients. These images are then subsequently reordered and co-added to give a single composite image of improved signal-to-noise ratio.

The above pair of experiments may be termed a "double shot" experiment and may be carried out with selection pulses which are not 90° and may be performed either on resonance, in which case there is no field offset $\Delta B$, or else off resonance.

Figure 3:
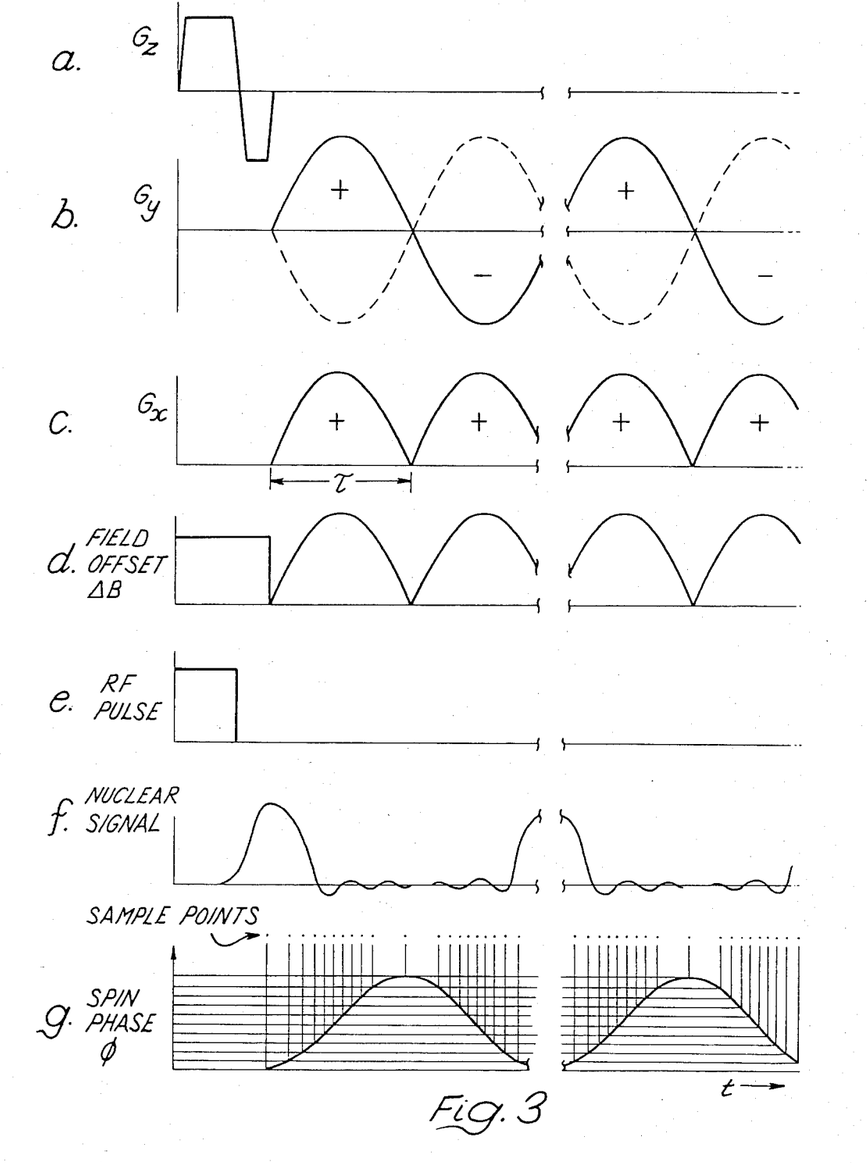
FIG. 3 shows an experiment with sinusoidal modulation and using non-linear sampling.

As an alternative to the cosinusoidal modulation described with reference to FIG. 2, it is possible to utilise sinusoidal modulation of the magnetic field gradients with periodicity $2\tau$ where all field modulations commence from zero and have sinusoidal waveforms throughout. Such an experiment is shown in FIG. 3. An initial RF pulse (FIG. 3e) is applied in the presence of a magnetic field gradient $G_z$ of low value, which is then reversed (FIG. 3a). The broadening gradient $G_x$ is then applied of form $G_x = c |\sin w_g t|$ as shown at FIG. 3c and the read gradient $G_y$ is applied as a sinusoidal modulation (FIG. 3b). A resonance offset field B (FIG. 3d) may also be applied if desired. The nuclear signal that is obtained is sketched at FIG. 3f. Since all gradients and field modulations start at zero magnitude, it is practically an easy business to switch on all modulations at $t=0$. The non-linear sampling as shown at FIG. 3g varies as predicted by a cosine function. A complementary experiment must also be performed with a Y-gradient modulation as indicated by the dashed line in FIG. 3b.

In the case of the sinusoidal modulation experiment described with reference to FIG. 3 the modulation of the $G_y$ gradient is not symmetrical about the time origin and the $G_y$ gradient changes direction during the formation of an echo signal. With such an arrangement sampling data obtained in the presence of a positive $G_y$ gradient alone does not give an undistorted picture. Furthermore sampling data from positive half cycles and negative half cycles of the $G_y$ gradient and reordering the latter also will not give a proper picture. Instead, to obtain a satisfactory picture data is sampled from positive half cycles of the $G_y$ gradient alone in one experiment and then the experiment is repeated with the phase of the magnetic field gradient reversed as shown dotted at FIG. 3b. In the second experiment it is the now positive half cycles of the $G_y$ gradient that are sampled corresponding to the times when the $G_y$ gradient was negative in the first experiment. The two time signals are joined to form a single time echo sequence which is now wholly positive in evolution. Fourier transformation of this data yields a correct image. However generation of this image takes two experiments to produce rather than one. With moving objects where motion is asynchronous, as for example in cardiac motion and other involuntary bodily motions, delay between taking the positive phase and the negative phase sine-modulated signals could be unacceptable. It is therefore desirable for the two experiments to be carried out without delay between them. However so that some magnetisation remains in the selected slice for the second experiment it is convenient that the first selective pulse is not a 90° pulse but nutates through a smaller angle. A 45° nutation angle can be used and in this case the second selective phase may have a 90° nutation angle. In general nutation angles $\theta_1, \theta_2 \ldots \theta_n$ may be used for n looks at the spin magnetisation, where each pulse is optimised to give equal signals typically reduced from the signal obtained from a 90° nutation pulse by a factor $1/\sqrt{n}$. Between the two experiments when there are no magnetic field gradients $G_y$ or $G_z$ in the Y or Z direction it may be advantageous to include a short intense magnetic field gradient in the X direction which further scrambles the decayed signal thus quenching any spin echo evolution which may form during the second experiment.

Figure 4:
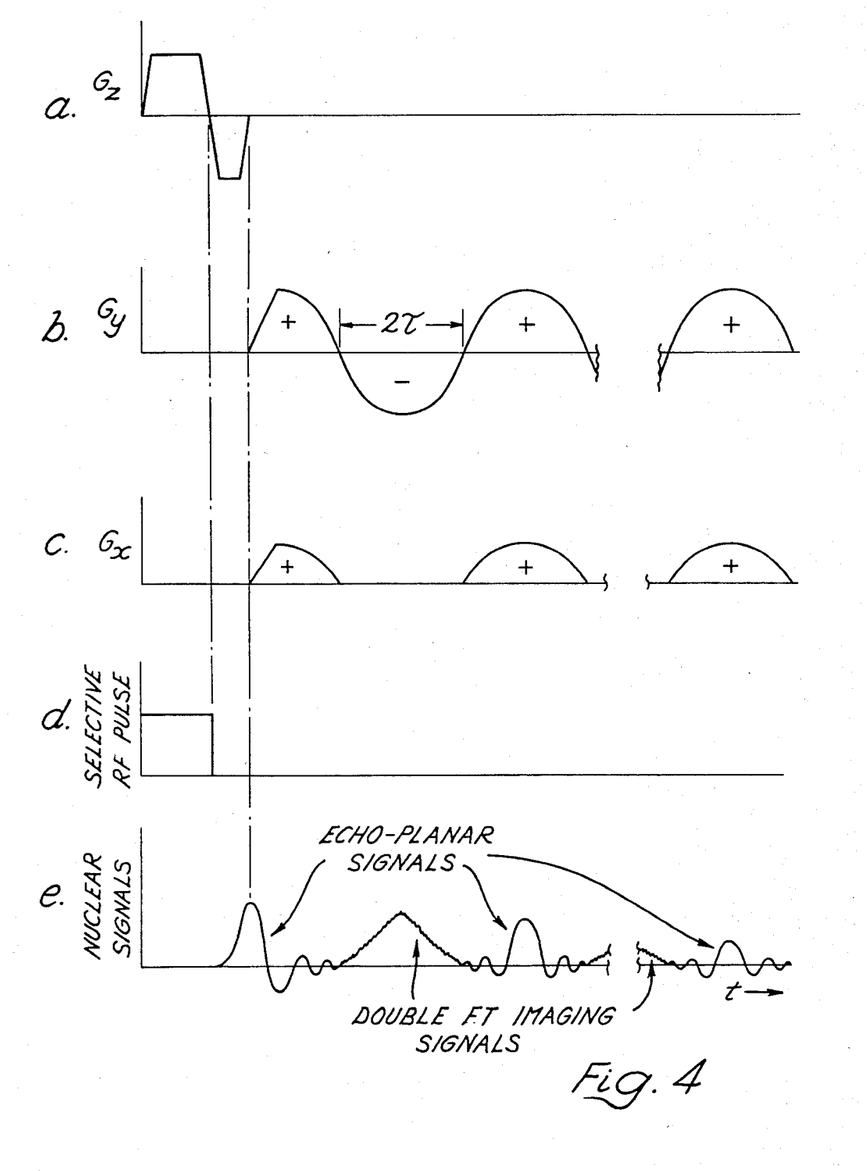
FIG. 4 shows a further experiment with cosinusoidal modulation and non-linear sampling.
Figure 5:
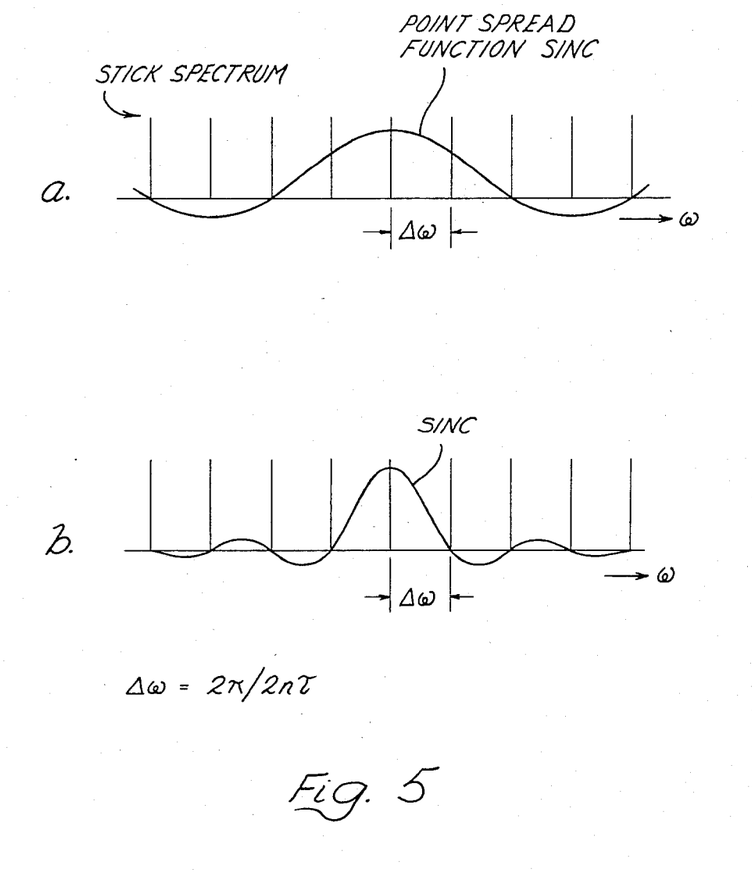
FIG. 5 shows point spread sinc functions for cosinusoidal and sinusoidal experiments of equal period.

In order to avoid the necessity for carrying out two consecutive experiments when using cosinusoidal modulation of period $4\tau$ it is possible, in accordance with a second aspect of the present invention, to carry out a modified form of experiment as illustrated in FIG. 5. A selective RF pulse shown at FIG. 4d is applied in the presence of a magnetic field gradient $G_z$ to select a slice as before. After this selection a cosinusoidal magnetic field gradient $G_y$ with a periodicity of $4\tau$ is applied as shown at FIG. 4b in like manner to the similar waveform shown in FIG. 2b. However the broadening gradient applied in the X direction is provided in alternate half cycles only of the $G_y$ gradient, as shown at FIG. 4c. In the intervening negative half cycles of gradient $G_y$ no broadening gradient $G_x$ is applied at all.

The signals obtained during the half cycles when both $G_y$ and $G_x$ are present are echo planar signals and these can be Fourier transformed in the manner described with reference to FIG. 2. In addition it will be found that nuclear signals will be generated in the intervening period when there is no $G_x$ gradient. These signals can be ignored if desired but if it is so wished they can be utilised since they contain information relating to nuclear spin resonance in the selected slice. Each such signal is an FID signal which is sampled non-linearly and is of the form $F(t_m,t_n)$ where $t_m$ are the non-equal time evolution periods of the spins in the presence of the $-G_y$ gradient and $t_n$ refers to the linear accumulated spin phase in successive periods when the broadening gradient $G_x$ is on. Double Fourier transformation of the signal $F(t_m,t_n)$ yields a two-dimensional spin distribution of resonances in the selected slice. Thus in one experiment it is possible to obtain two complete images, namely an echo-planar image and a modified two-dimensional Fourier transform image.

The experiment described with reference to FIG. 4 may be done either on resonance as illustrated or else off resonance by the use of a magnetic field offset $\Delta B(t)$. However the off resonance case requires a precise setting of the amplitude of the static field offset so that there is an exact number of cycles of spin evolution in the periods when there is no magnetic field gradient $G_x$ in the X direction.

The experiment described with reference to FIG. 4 makes the collection of echo-planar data take twice as long. This additional time need not be wasted since as described above additional Fourier transform data can be collected in that time. Nevertheless due to losses caused by spin-spin interactions which take place in a time $T_2$ it may be impractical to double the experimental data gathering time. An alternative is to use a different negative waveform for the magnetic field gradient $G_y$ to perform the spin echo refocussing. For example negative gradient spikes in place of the half sine curves would be equally efficacious provided that the total area under the spike is equal to that under the positive half sine. In the limit of a delta function spike the total experimental time decreases by a factor of 2.

An advantage with double shot cosine-modulated or sine-modulated experiments provided by the present invention is that the effect of truncation by gradient switcheing is minimised, since the gradient is in the same direction for twice as long as the single shot cosine-modulated experiments for equal modulation periods. The point spread sinc function, produced by the truncation, now falls to zero at the positions where successive stick spectra occur. This is illustrated by FIG. 5b which shows a spread function for a double shot sine experiment with the modulation period of $G_y$ equal to $2\tau$. Thus, on broadening of the stick spectra, the resolution has been improved considerably along one axis of the picture. This resolution is to be compared with that of the single shot cosine experiment of FIG. 2. In this case the point spread sinc function is shown in FIG. 5a for the single shot cosine experiment of equal modulation period. The sinc zero crossings occur at twice the stick spectrum spacing, thus considerably degrading the point resolution between adjacent picture lines. However the same resolution can be obtained in a double shot cosine experiment running at half the frequency of the corresponding sine experiment.

Figure 6:
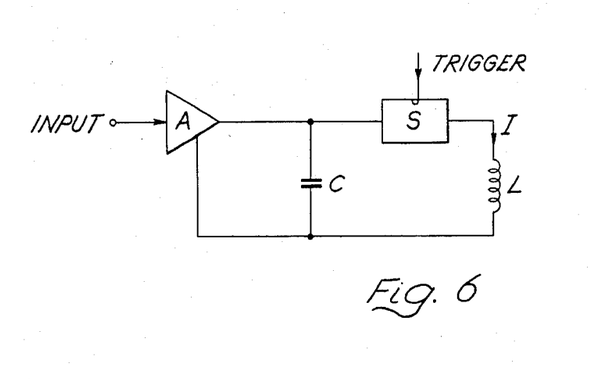
FIG. 6 is a diagram of a suitable circuit for driving a magnetic field gradient coil.

An advantage of using sinusoidal or cosinusoidal modulation is that the coil arrangement by which a magnetic field gradient is applied to a sample can be made part of a tuned resonant circuit. This allows the current through the coil to be higher than the current supplied by a generator by a factor Q which is a quality factor of the tuned circuit and is give by $Q=\omega L/r$, where $\omega$ is the angular resonant frequency, L is the inductance of the circuit and r is the series resistance. The use of a resonant circuit also allows switching of the current through the coil to take place at instants of zero current. A suitable circuit is shown in FIG. 6. It comprises a DC coupled audio frequency amplifier A the output of which feeds a capacitor C across which is connected an inductance L representing the gradient coil arrangement and a switch S. Switch S can be a mechanical, solid state or other electronic switch. Capacitor C is initially charged from amplifier A and when switch S is closed the capacitor discharges to generate sinusoidal current I through coil L of magnitude given by $I=QI_d$ where $I_d$ is the drive current from amplifier A. By opening switch S when the current through coil L is zero, at which time the voltage across capacitor C is a maximum, and then closing switch S at a subsequent time separate half cycles of magnetic field can be produced of alternate directions separated from each other by the time during which switch S is open.

Figure 7:
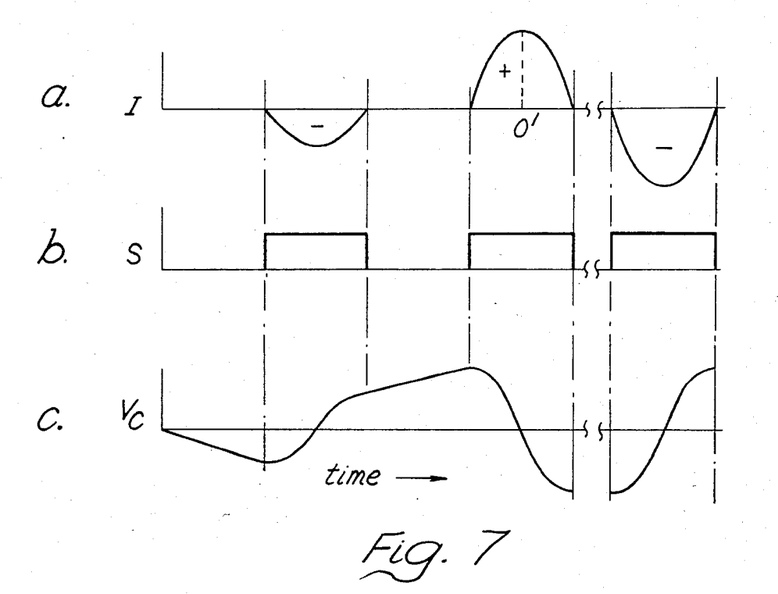
FIG. 7 shows a switching sequence that can be used with the circuit of FIG. 6.

In certain circumstances a cosinusoidal current waveform is required commencing from a maximum value. While this is difficult to achieve in a practical arrangement a similar effect can be obtained by utilising the switching sequence shown in FIG. 7. The current through the gradient coil is shown at FIG. 7a. The cosinusoidal waveform proper commences at O' and is preceded by a quarter sine wave of current so that the complete current pulse is a half sine wave, which can be generated without difficulty. To obtain the required cosinusoidal-type effect the half-sine pulse is preceded by a prepulse of half-sine shape and of opposite polarity before launching into the sinusoidal modulation. The time integral of the prepulse is half that of the initial pulse proper. This ensures that at origin O' there is zero nett spin phase accumulation in $G_y$. The trigger periods during which switch S is closed is shown at FIG. 7b and the resulting voltage $V_c$ across capacitor C is as in FIG. 7c. This prepulse facility for a cosine start can be used to advantage in previously described experiments embodied in FIG. 2 and FIG. 4, and in an experiment which will be described below in connection with FIG. 11.

As drawn all these Figures show an initial ramp-up to start off the cosine modulation for both $G_y$ and $G_x$. While it is not difficult to achieve such a start for a small amplitude broadening gradient $G_x$ such a ramp start for a larger amplitude gradient such as is applied in the Y direction can be difficult to achieve in practice. In such instances a prepulse is of value.

Figure 8:
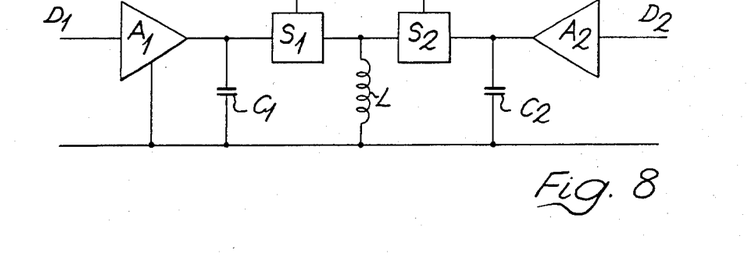
FIG. 8 is a diagram of an alternative circuit to that shown in FIG. 6.
Figure 9:
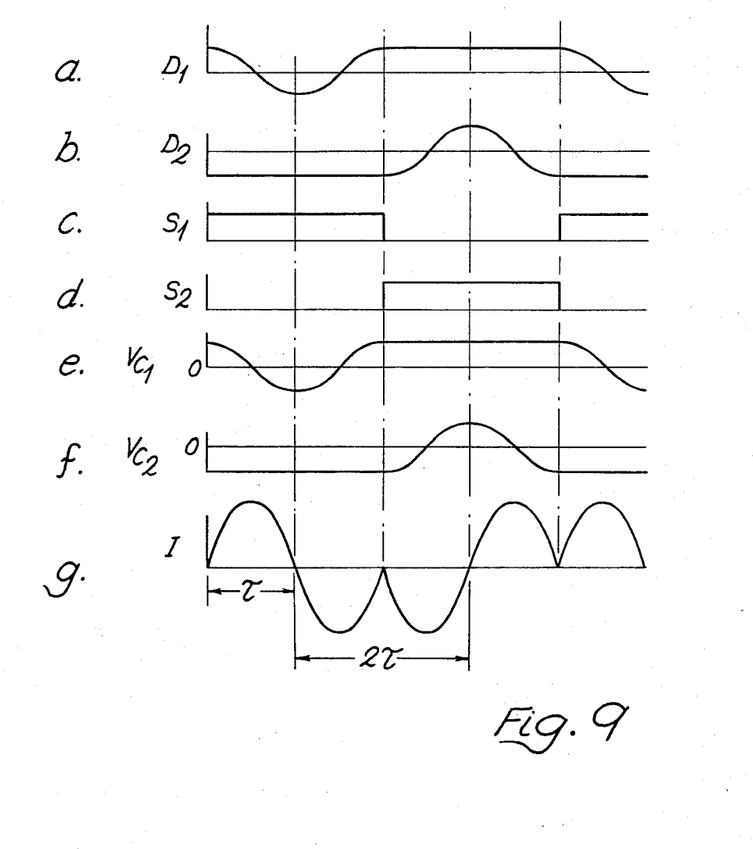
FIG. 9 shows a switching sequence applicable to the circuit of FIG. 8.

The circuit diagram illustrated in FIG. 6 can be expanded along the lines shown in FIG. 8. The gradient coil indicated as inductance L is now driven by two amplifiers $A_1$ and $A_2$ which each charge respective capacitors $C_1$ and $C_2$. The capacitors can be switched to discharge through the inductance L through one or other of two bi-directional switches $S_1$ and $S_2$. It is usually appropriate to make the two capacitors $C_1$ and $C_2$ of equal capacity and the two resonant circuits formed by $C_1$ and L and $C_2$ and L will have the same resonant frequency and the same value of Q. In order to generate the current waveform through inductance L shown at FIG. 9g drive currents $D_1$ and $D_2$ to the amplifiers $A_1$ and $A_2$ are as shown in FIGS. 9a and 9b respectively. The switching patterns for closing switches $S_1$ and $S_2$ are as shown at FIGS. 9c and 9d, where it will be noted that at no time are both switches closed simultaneously. The voltages $V_{c1}$ and $V_{c2}$ on the capacitors $C_1$ and $C_2$ are as shown in FIGS. 9e and 9f.

It may be noted that the gradient coil current waveform I although generated from a series of half sine waveforms, in fact has cosinusoidal symmetry and avoids the gradient prepulse discussed above. A disadvantage of using a "double bounce" cosine is that switching "glitches" occur at both zero crossing and the waveform cusps. The cusp occurs at an echo maximum, but the gradient $G_y$ is zero here, so spin evolution is relatively slow. Editing out cusp glitches in the signal may therefore be done by a simple interpolation procedure in which sampling points are moved to each side of the glitch and a mean value computed at the cusp itself.

An important advantage with either sinusoidal or cosinusoidal variation of gradients is that when used to investigate live patients switching transients in the patient are minimised and therefore risk reduced.

A limitation of the sampling time and hence signal-to-noise ratio in an echo-planar image is spin-spin relaxation, characterised by the parameter $T_2$, which effects spin-echo recovery. A further practical limitation of pixel resolution and hence picture matrix size is the maximum amplitude of the magnetic field gradient $G_y$ that may reasonably be generated. There is now described a method in which a single shot echo-planar experiment is broken down into a series of more manageable experiments with each individual experiment taking place in a time short enough to be relatively unaffected by spin-spin relaxation. The method described utilises non-linear sampling of the nuclear signals.

Since in general in echo-planar experiments $G_y=lG_x$, where l (an integer) is the matrix size and further since the spatial resolution $\Delta x$ is given by: $\Delta x=2\pi/2l\tau\gamma G_x$ then for a given spatial resolution $\Delta x$ and a longer time $\tau$ it is possible to reduce $G_y$. However for a given matrix size l and a given $T_2$ such an increase in $\tau$ is limited. Breaking the experiment into shorter parts overcomes this problem.

The experimental sequence is described with reference to FIG. 10. An individual experiment commences with the application of a selective RF pulse in the presence of a magnetic field gradient $G_z$ in the Z direction, followed by a negative $G_z$ gradient. The waveform of the $G_z$ gradients is shown at FIG. 10a and the RF pulse is shown at FIG. 10d. The RF pulse may be a 90° pulse or may have any other nutation angle O. In general it will be of the form $R_\alpha(\theta)$ where the subscript $\alpha$ refers to the RF carrier phase principle axis in the rotating reference frame. A cycle is terminated by the complementary selective RF pulse of waveform $R_{-\alpha}(\theta)$ in the presence of a magnetic field gradient $G_z$ complementary to the initial $G_z$ gradient. The pair of pulses $R_\alpha(\theta)$ and $R_{-\alpha}(\theta)$ constitutes a conjugate pulse pair having the effect of returning any transverse magnetisation back along the Z spin polarisation axis. The experiment may be repeated rapidly in the manner of a modified driven equilibrium Fourier transform (DEFT) experiment.

During a cycle a phase priming gradient $G_x$ is initially applied in the X direction the time integral of which has a value $A_n$. This phase priming gradient is used to set up the spins in an orientation in which they would have existed at a particular time during the experiment had there been no effect due to $T_2$, that is to say had the echo-planar gradient modulation been started earlier.

Figure 10:
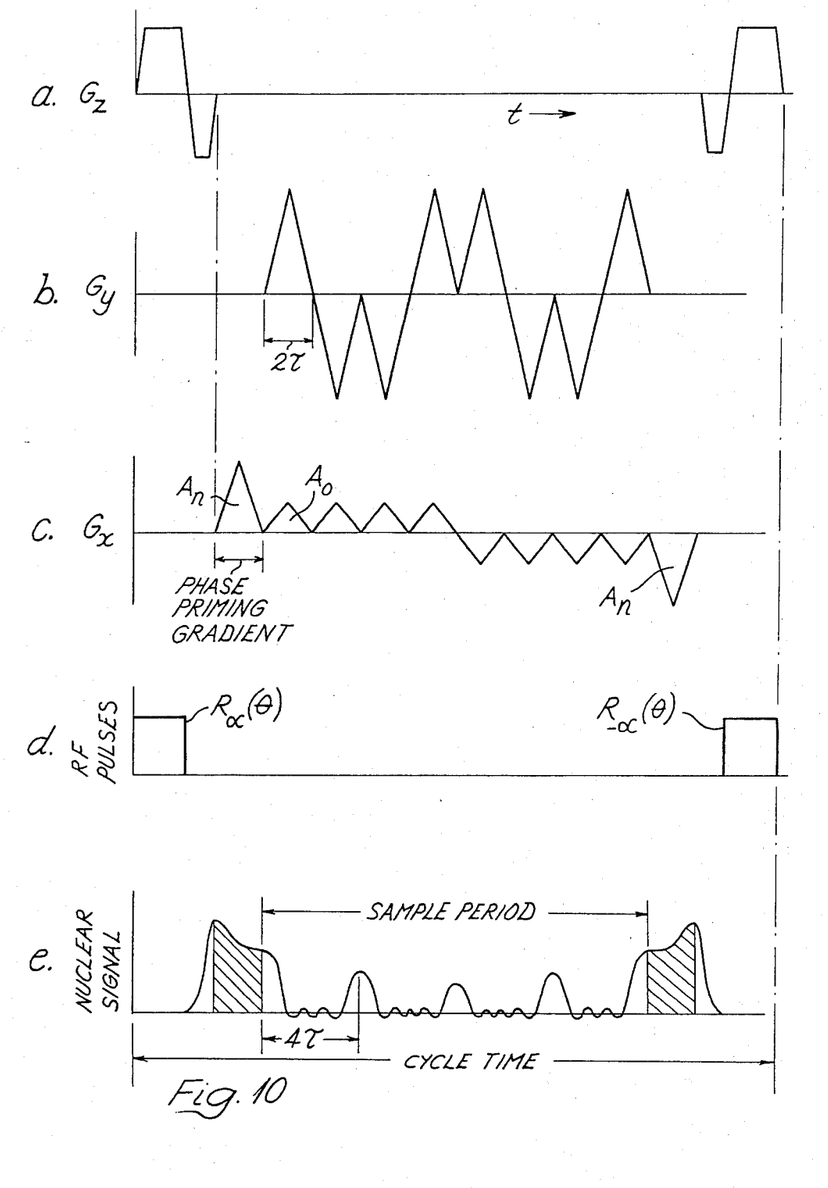
FIG. 10 shows another experiment enabling longer period examinations.

A magnetic field gradient $G_y$ is then applied in the Y direction with a cyclic pattern of positive and negative gradients as set out in FIG. 10b. Each half cycle has a time period of $2\tau$. The nett effect of the application of the $G_y$ gradient after the complete cycle illustrated has been carried out is zero. During the time that the read gradient $G_y$ is applied the broadening gradient $G_x$ in the X direction is also applied in synchronism therewith as shown in FIG. 10c. The $G_x$ gradient also consists of a sequence of half cycles, the half cycles being positive in the first half of the experiment and negative in the second half or vice versa. After the complete cycle of the application of the $G_y$ gradients is completed a negative $G_x$ gradient of time integral $A_n$ is then applied. This refocusses the spins and then the experiment is terminated by the second pulse of the conjugate pair of RF pulses which is applied in the presence of the complementary $G_z$ gradient field in order to return the spins predominantly along the Z axis.

After a suitable wait period the experiment described above may be repeated so as to give a continuously running method of collecting data. The value of $A_n$ in a particular experiment is given by $$A_n = n\Delta A$$

where $\Delta A = 4A_o$ as illustrated, but could include $\underline{m}$ sub-cycles, in which case $\Delta A = 4mA_o$, where $\underline{m}$ is an integer 1, 2, 3 etc. and $A_o$ is the time integral of any one half period 0, 1, 2, etc. and is stepped for each successive experiment so that a different part of the time domain is investigated in turn.

The above sequence of experiments has been described as being carried out without a field offset to the static magnetic field. If it is desired to carry out a sequence of experiments off resonance then a field offset is required which is varied in synchronism with the $G_x$ gradient field. The value of the field offset prepulse is different for each successive experiment and in general has a value, $B_n$ where $B_n = n\Delta B$ and $\Delta B = 4mB_o$; and $B_0$ is the signal evolution in a half period due to the field offset term and as illustrated $\underline{m}=1$.

The waveforms of the time variation of the read gradient $G_y$ and broadening gradient $G_x$ are shown in FIG. 10 as having triangular shapes. However the arrangement described with reference to FIG. 10 is in no way limited to triangular modulation but half sine or trapezoidal modulation can be used or in fact any other repetitive waveform that it is convenient to generate. Furthermore any suitable arrangement for gradient switching can be used.

Figure 11:
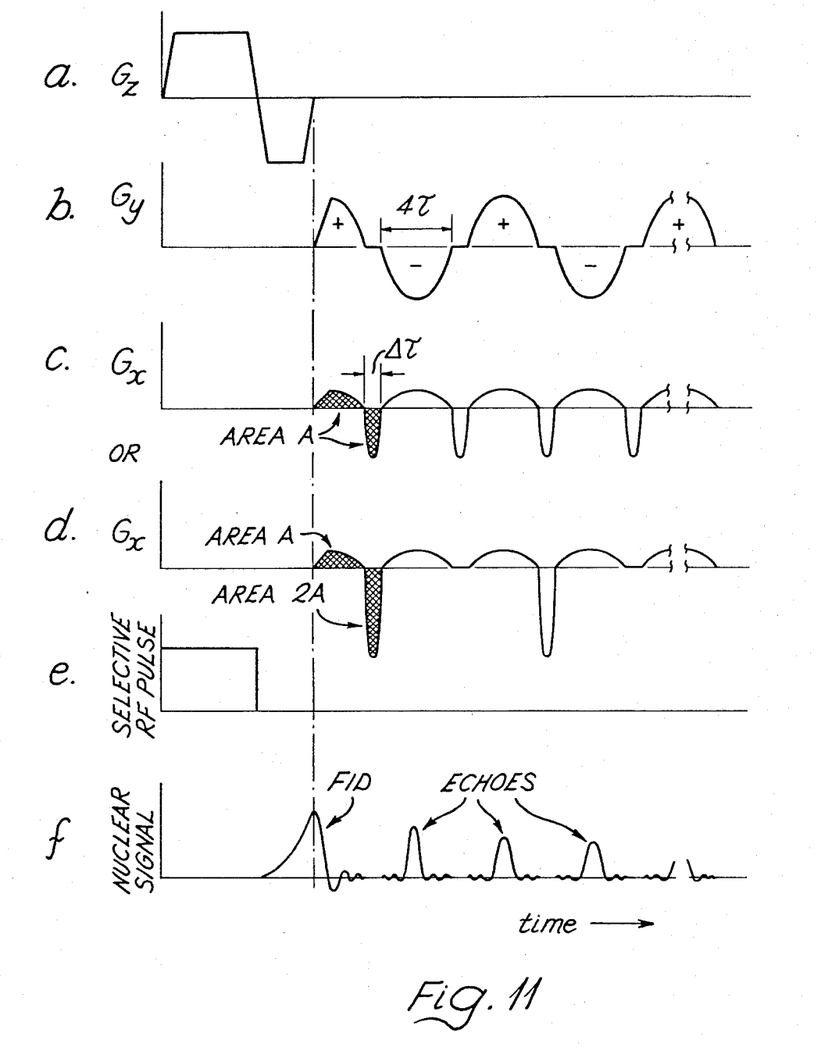
FIG. 11 shows yet another experiment with cosinusoidal modulation.

An improvement of echo-planar imaging in accordance with the third aspect of the invention will now be described with reference to FIG. 11. This particular method is a single shot experiment with cosinusoidal modulation and it has a spatial resolution equal to that of the double shot experiment with sinusoidal modulation. Selection of a slice or plane is performed as described previously by the application of a selective RF pulse shown in FIG. 11e in the presence of a magnetic field gradient $G_z$ in the Z direction as shown in FIG. 11a. Gradient $G_z$ has trapezoidal modulation and is followed by a reversed gradient field $G_z$ of half the time integral to give focussed magnetisation. The read gradient $G_y$ is initially ramped up and is then cosine modulated with a period for each half cycle of $4\tau$. However between each half cycle there is a small time gap $\Delta\tau$ during which no gradient $G_y$ is applied at all. The waveform of the gradient $G_y$ is shown in FIG. 11b. The broadening gradient $G_x$ in the X direction is applied in synchronism with the $G_y$ gradient and is in the same direction (positive in FIG. 11c) for both the positive and negative excursions of the $G_y$ gradient. However in the time gaps $\Delta\tau$ when the $G_y$ gradient is zero the broadening gradient $G_x$ is applied in the reverse direction as a half-sine pulse or spike with a magnitude such that the time integral after the first pulse is equal to the time integral of the immediately preceding magnetic field gradient $G_x$ in the positive X-direction (see hatched areas in FIG. 11c). The effect of this equalisation of time integrals is to exactly cancel the spin phase evolution in the X direction at the end of the spike. In the following half cycle of modulation of time $4\tau$ during which the read gradient field $G_y$ is in the negative direction the spin phase in the X direction will evolve afresh. At the end of this half cycle there will be another reversed spike of magnetisation in the $-X$ direction of time integral equal to the previous spike. At the end of this second spike therefore only half the phase evolution is cancelled so that the spin phase in the X direction is prepared in a state equivalent to that which would have occurred if the negative evolution of spins in the $-Y$ direction had not occurred. That is to say sampling just the even echoes which occur during the application of the positive gradient $G_y$ results in a correctly ordered single shot signal which when Fourier transformed yields an undistorted image with equivalent sine resolution. The FID signal and echoes that are obtained are illustrated in FIG. 11f. These signals are sampled non-linearly as previously described.

As a modification to the scheme described with reference to FIG. 11 the spikes of broadening gradient $G_x$ which are applied in the $-X$ direction can have a time integral double the time integral of the initial cosine modulation of $G_x$ but these spikes are then applied only during alternate time gaps in the modulation. This is shown in FIG. 11d. It is desirable to keep the width of the time gap $\Delta\tau$ as short as possible in order to keep the total experimental time short.

It will be appreciated that whilst the methods described above have been described in the content of obtaining an image or other indication of nuclear magnetic resonance spin density in a sample, the methods according to the present invention are equally applicable to other methods of investigating a body e.g. methods of obtaining an indication of the spatial distribution of other chosen NMR quantities, e.g. NMR spin relaxation time constants or chemical shift.

Similarly whilst the methods according to the invention have been described in the context of investigating a slice of a body, the methods may equally be used in investigating a volume of a body, i.e. a plurality of adjacent slices simultaneously.

We claim:

1. A method of investigating a body by nuclear magnetic resonance comprising: preferentially exciting nuclear magnetic resonance in a slice of the body; applying for a first period a magnetic field to said body with first and second gradients in first and second directions respectively in said slice, and the first gradient subjected to a modulation such that the sense of said first gradient is periodically reversed; re-exciting said slice and re-applying said magnetic field for a second period but with the first gradient periodically reversed in sense with opposite phase to that obtaining during said first period; detecting the resultant free induction decay signals occurring during each said period of application of said magnetic field; editing the detecting signals to obtain a set of signals comprising those signals occurring when said first gradient has one sense; and processing said set of signals to retrieve data.

2. A method according to claim 1 wherein: the detected free induction decay signals are edited to obtain a first set of signals comprising those signals occurring when said first gradient has one sense and a second set of signals comprising those signals occurring when said first gradient has the opposite sense; the two set of signals are respectively processed to retrieve data; and the resultant data is re-ordered and added.

3. A method according to claim 1 wherein said second gradient is modulated in synchronism with said modulation to which said first gradient is subjected.

4. A method according to claim 1 wherein said modulation to which said first gradient is subjected is symmetric about a time origin of said modulation.

5. A method according to claim 4 wherein said modulation to which said first gradient is subjected is cosinusoidal.

6. A method according to claim 1 wherein said modulation to which said first gradient is subjected is non-symmetric about a time origin of said modulation.

7. A method according to claim 6 wherein said modulation to which said first gradient is subjected is sinusoidal.

8. A method according to claim 1 wherein an offset magnetic field modulated in synchronism with said first gradient is applied.

9. A method according to claim 1 wherein the free induction decay signals are detected by sampling at intervals such that the integral with respect to time for the said gradient field is substantially the same in each interval between successive samples.

10. A method according to claim 1 wherein the preferential excitation of the slice preceding the first period nutates the spins in the slice through less than 90° to allow the re-excitation of the slice preceding the second period to follow the first period without delay.

11. A method of investigating a body by nuclear magnetic resonance comprising: preferentially exciting nuclear magnetic resonance in a slice of the body; applying a magnetic field to said body with first and second gradients in first and second directions respectively in said slice, said first gradient being periodically reversed and said second gradient being applied only during periods when the first gradient has one of its two possible senses; detecting the free induction decay signals occurring during application of said magnetic field; assembling the resulting signals occurring during periods when said first and second gradients are both applied to form a first set of signals; assembling the resulting signals occurring during periods when only said first gradient is applied to form a second set of signals; processing the first set of signals by single Fourier transformation to derive data; and processing said second set of signals by double Fourier transformation to derive further data.

12. A method of investigating a body by nuclear magnetic resonance comprising: preferentially exciting nuclear magnetic resonance in a slice of the body; applying a magnetic field to said body with first and second gradients in first and second directions respectively in said slice, said first gradient being periodically removed for a period and then re-applied with its sense reversed, and said second gradient having one sense during each period when said first gradient is applied and being of the opposite sense at least during some of the periods when said first gradient is removed; and the magnitude of the second gradient being controlled so that the time integral of the second gradient at the beginning of each period when the first gradient has a given sense is substantially equal to the integral of the second gradient at the end of the preceding period when said first gradient had said given sense; detecting the free induction decay signals occurring during each period when said first gradient has said given sense, and processing the detected signals to retrieve data.

13. A method of investigating a body by nuclear magnetic resonance, said method comprising the steps of:
 (a) preferentially exciting nuclear magnetic resonance in a slice of the body;
 (b) applying for a first period a magnetic field to said body with first and second gradients in first and second directions respectively in said slice;
 (c) subjecting said first gradient to a modulation which is symmetric about a time origin of said modulation so that the sense of said first gradient is periodically reversed;
 (d) re-exciting said slice and re-applying said magnetic field for a second period but with the first gradient periodically reversed in sense with opposite phase to that obtaining during said first period;
 (e) detecting the resultant free induction decay signals occurring during each application of said magnetic field;
 (f) editing the detected signals to obtain a set of signals occurring when said first gradient has one sense, and
 (g) processing said set of signals to retrieve data.

14. The method of claim 13, wherein said modulation subjecting step comprises cosinusoidally modulating said first gradient.

15. A method of investigating a body by nuclear magnetic resonance, said method comprising the steps of:
 (a) preferentially exciting nuclear magnetic resonance in a slice of the body;
 (b) applying for a first period a magnetic field to said body with first and second gradients in first and second directions respectively in said slice and the first gradient subjected to a modulation such that the sense of said first gradient is periodically reversed;
 (c) applying an offset magnetic field modulated in synchronism with said modulation of said first gradient;
 (d) re-exciting said slice and re-applying said gradient magnetic field for a second period but with the first gradient periodically reversed in sense with opposite phase to that obtaining during said first period;
 (e) detecting the resultant free induction decay signal occurring during each application of said gradient magnetic field;
 (f) editing the detected signals to obtain a set of signals occurring when said first gradient has one sense, and
 (g) processing said set of signals to retrieve data.

16. A method of investigating a body by nuclear magnetic resonance, said method comprising the steps of:
 (a) preferentially exciting nuclear magnetic resonance in a slice of the body;
 (b) applying for a first period a magnetic field to said body with first and second gradients in first and second directions respectively in said slice;
 (c) subjecting said first gradient to a sinusoidal modulation which is non-symmetric about a time origin of said modulation so that the sense of said first gradient is periodically reversed;
 (d) re-exciting said slice and re-applying said gradient magnetic field for a second period but with the first gradient periodically reversed in sense with opposite phase to that obtaining during said first period;
 (e) detecting the resultant free induction decay signal occurring during each application of said gradient magnetic field;
 (f) editing the detected signals to obtain a set of signals occurring when said first gradient has one sense, and
 (g) processing said set of signals to retrieve data.

17. A method of investigating a body by the use of nuclear magnetic resonance, said method comprising:
 (a) preferentially exciting nuclear magnetic resonance in a slice of the body;
 (b) applying for a first period a magnetic field to said body having first and second gradients in first and second directions respectively in said slice, the sense of said first gradient being periodically reversed;
 (c) re-exciting said slice and re-applying said magnetic field for a second period with said reversal of said sense of said first gradient being opposite in phase relative to the phase of said sense reversal obtaining during said first period;
 (d) detecting resultant free induction decay signals corresponding to each said period of application of said magnetic field, and
 (e) processing the detected signals to retrieve data.

18. A system for investigating a body by the use of nuclear magnetic resonance, said system comprising:

(a) apparatus and circuitry for preferentially exciting nuclear magnetic resonance in a slice of said body;

(b) apparatus and circuitry for applying during a first period a magnetic field to said body having first and second gradients in first and second directions respectively in said slice, the sense of said first gradient being periodically reversed;

(c) control means for actuating said magnetic field applying apparatus and circuitry for re-exciting said slice and re-applying said magnetic field for a second period while reversing the phase of reversal of said periodically reversing sense of said first gradient;

(d) means for detecting resultant free induction decay signals occcurring during each said period of said application of said magnetic field, and (e) circuitry for processing said detected signals to retrieve data therefrom.

19. A method of investigating a body by nuclear magnetic resonance, said method comprising the steps of:

(a) preferentially exciting nuclear magnetic resonance in a slice of the body;

(b) applying for a first period a magnetic field to said body with first and second gradients in first and second directions respectively in said slice, the sense of said first gradient being periodically reversed;

(c) re-exciting slice and re-applying said magnetic field for a second period but with the first gradient is periodically reversed in sense with respect to the sense obtaining during said first period;

(d) detecting resultant free induction decay signals corresponding to each said period of application of said magnetic field;

(e) editing the detected free induction decay signals to obtain:
  (i) a first set of signals comprising those signals corresponding to said first gradient having one sense, and
  (ii) a second set of signals comprising those signals corresponding to said first gradient having the opposite sense;

(f) respectively processing the two sets of signals to retrieve data, and (g) reordering and adding the resultant data.

* * * * *

UNITED STATES PATENT AND TRADEMARK OFFICE
CERTIFICATE OF CORRECTION

PATENT NO. : 4,509,015

DATED : April 2, 1985

INVENTOR(S) : Roger J. Ordidge and Peter Mansfield

It is certified that error appears in the above-identified patent and that said Letters Patent is hereby corrected as shown below:

Column 4, line 2, "$\cap$" should be --$\omega$--;

Column 7, line 10, "FIG. 5" should be --FIG. 4--;

Column 12, line 40, "set" should be --sets--;

Column 15, line 15, "occcurring" should be --occurring--;

Column 16, line 6, before "slice" insert --said--;

Column 16, line 8, delete "is".

Signed and Sealed this

Twenty-seventh Day of August 1985

[SEAL]

Attest:

DONALD J. QUIGG

Attesting Officer

Acting Commissioner of Patents and Trademarks